(12) United States Patent
Frulio et al.

(10) Patent No.: US 7,301,814 B2
(45) Date of Patent: Nov. 27, 2007

(54) SYSTEM AND METHOD FOR AVOIDING OFFSET IN AND REDUCING THE FOOTPRINT OF A NON-VOLATILE MEMORY

(75) Inventors: Massimiliano Frulio, Milan (IT); Riccardo Riva Reggiori, Segrate (IT); Andrea Sacco, Alessandria (IT); Luca Figini, Lomazzo (IT)

(73) Assignee: Atmel Corporation, San Jose, CA (US)

( * ) Notice: Subject to any disclaimer, the term of this patent is extended or adjusted under 35 U.S.C. 154(b) by 0 days.

(21) Appl. No.: 11/126,473

(22) Filed: May 11, 2005

(65) Prior Publication Data

US 2006/0077709 A1  Apr. 13, 2006

(30) Foreign Application Priority Data

Oct. 12, 2004  (IT)  ................. MI2004A001927

(51) Int. Cl.
*G11C 11/34* (2006.01)
*G11C 16/06* (2006.01)

(52) U.S. Cl. .................. 365/185.2; 365/185.21; 365/185.22

(58) Field of Classification Search ............ 365/185.2, 365/185.21, 185.22, 210, 158, 171, 173, 365/53, 54

See application file for complete search history.

(56) References Cited

U.S. PATENT DOCUMENTS

| | | | |
|---|---|---|---|
| 5,333,300 A | 7/1994 | Fandrich | |
| 5,355,464 A | 10/1994 | Fandrich et al. | |
| 5,539,690 A * | 7/1996 | Talreja et al. | 365/185.22 |
| 5,638,326 A * | 6/1997 | Hollmer et al. | 365/185.2 |
| 5,717,632 A * | 2/1998 | Richart et al. | 365/185.2 |
| 5,717,634 A | 2/1998 | Smayling et al. | |
| 5,732,021 A | 3/1998 | Smayling et al. | |
| 5,737,748 A | 4/1998 | Shigeeda | |
| 5,737,764 A | 4/1998 | Shigeeda | |
| 5,737,765 A | 4/1998 | Shigeeda | |
| 5,778,425 A | 7/1998 | Shigeeda | |
| 5,828,601 A * | 10/1998 | Hollmer et al. | 365/185.2 |
| 5,844,839 A | 12/1998 | Smayling et al. | |
| 6,044,022 A | 3/2000 | Nachumovsky | |
| 6,118,708 A * | 9/2000 | Yoshida et al. | 365/190 |
| 6,185,128 B1 * | 2/2001 | Chen et al. | 365/185.11 |
| 6,262,914 B1 | 7/2001 | Smayling et al. | |
| 6,438,039 B1 | 8/2002 | Liu et al. | |
| 6,459,620 B1 | 10/2002 | Eshel | |
| 6,504,778 B1 * | 1/2003 | Uekubo | 365/207 |
| 6,574,141 B2 | 6/2003 | Baltar | |
| 6,725,178 B2 | 4/2004 | Cheston et al. | |

* cited by examiner

*Primary Examiner*—Van Thu Nguyen
*Assistant Examiner*—Allison P Bernstein
(74) *Attorney, Agent, or Firm*—Sawyer Law Group LLP

(57) ABSTRACT

A system and method for avoiding offset in and reducing the footprint of a non-volatile memory that has a plurality of memory bank circuits. Each memory bank circuit has memory cells coupled to sense amplifiers, row and column decoders coupled to the memory cells, and bias circuits coupled to the sense amplifiers. The system includes a reference cell matrix coupled to each of the plurality of memory bank circuits. The reference cell matrix is configured to provide reference cell current for each of the plurality of memory bank circuits.

14 Claims, 3 Drawing Sheets

SYSTEM AND METHOD FOR AVOIDING OFFSET IN AND REDUCING THE FOOTPRINT OF A NON-VOLATILE MEMORY

CROSS-REFERENCE TO RELATED APPLICATIONS

This application claims benefit under 35 USC 119 of Italian Application no. MI2004A 001927, filed on Oct. 12, 2004.

FIELD OF THE INVENTION

The present invention relates to non-volatile memory, and more particularly to avoiding offset in and reducing the footprint of a non-volatile memory.

BACKGROUND OF THE INVENTION

Non-volatile memory is a type of memory that preserves data with or without power applied to the memory. Most computer and electronic systems use a binary number system with bits. Two distinctly different current levels that flow through the memory under the correct conditions represent each bit, a one or a zero.

Some memory is single-level, where one bit of information is stored in each memory cell. In order to determine the value of the memory cell, current through the memory cell is compared to a reference memory cell. A current through the memory cell that is lower than that through the reference cell represents one bit value, while a current through the memory cell that is higher than that through the reference cell represents the other bit value.

In advanced memory devices, it is desirable to simultaneously perform multiple operations on memory, for example read while writing, or read while erasing. In order to achieve this, a memory device is organized into smaller blocks of memory called 'banks.' One operation may be performed on one bank while another operation is performed on another bank.

In one memory architecture, a set of sense amplifiers handles 'read' operations for the banks of memory and another set of sense amplifiers handles 'verify' operations for the banks. The offset between the two sets of amplifiers reduces current within the memory device and causes associated performance problems.

FIG. 1 is a schematic diagram illustrating one solution to this problem with conventional system 90. System 90 is a non-volatile memory with memory banks 100 connected to Y-decoder and sense amplifier circuit 102, and to X-decoder circuit 104. Rather than having only two sets of amplifiers, as in previously described memory architecture, each memory bank 100 has amplifier circuit 102.

In order to read a memory cell (see FIG. 2) from memory bank 100, bias circuit 103 activates a reference cell current from reference matrix 101. The reference cell current is mirrored from reference matrix 101 through bias circuit 103 to amplifier circuit 102. Amplifier circuit 102 compares the reference cell current to a memory cell current through memory bank 100 in order to determine the value in a memory cell.

FIG. 2 is a schematic diagram illustrating components of conventional system 90 from FIG. 1. Bias circuit 103 includes transistor 110, which, during a memory read, for example, activates reference matrix 101. Reference matrix 101 includes transistors 112 and 114. Transistor 114 is also activated during a memory read, which causes a reference cell current to flow through reference cell 118. Cell 116 is used during verify operations. Current through reference cell 118 flows through transistor 120 and is mirrored by transistor 122, and caused to flow through transistor 124.

In Y-decoder and amplifier circuit 102, transistor 126 mirrors reference cell current and causes it to flow through transistor 128. As part of the memory read operation, memory block 100 with memory cell 130 is biased by transistor 132, causing current to flow, with a voltage drop across transistors 132 and memory cell 130, and other associated components that are not illustrated for simplicity. Sense amplifier 134 compares the current through (or voltage across) memory cell 130 with the current through reference cell 118. The bit value stored in memory cell 130 is related to the current through memory cell 130 relative to current through reference cell 118.

One problem with conventional system 90 is that it takes a large amount of space to implement (it has a large "footprint"). Another problem is that it takes a significant amount of time to test conventional system 90.

Accordingly, what is needed is a system and method for avoiding offset, reducing the footprint and decreasing test time in a non-volatile memory. The present invention addresses such a need.

SUMMARY OF THE INVENTION

The present invention provides a system and method for avoiding offset, reducing test time and reducing the footprint of a non-volatile memory that has a plurality of memory bank circuits. Each memory bank circuit has memory cells coupled to sense amplifiers, row and column decoders coupled to the memory cells, and bias circuits coupled to the sense amplifiers. The system includes a reference cell matrix coupled to each of the plurality of memory bank circuits. The reference cell matrix is configured to provide reference cell current for each of the plurality of memory bank circuits.

According to the method and system disclosed herein, the present invention reduces the footprint necessary by connecting a single reference cell matrix to multiple memory banks, rather than having a single reference cell for each memory bank. Offset has not been affected over conventional system 90 because there are still sets of sense amplifiers for each memory bank, and testing time is improved over a conventional system.

DETAILED DESCRIPTION OF THE INVENTION

The present invention relates to non-volatile memory, and more particularly to avoiding offset in and reducing the footprint of a non-volatile memory.

The following description is presented to enable one of ordinary skill in the art to make and use the invention and is provided in the context of a patent application and its requirements. Various modifications to the preferred embodiments and the generic principles and features described herein will be readily apparent to those skilled in the art. Thus, the present invention is not intended to be limited to the embodiments shown, but is to be accorded the widest scope consistent with the principles and features described herein.

Figure 3:
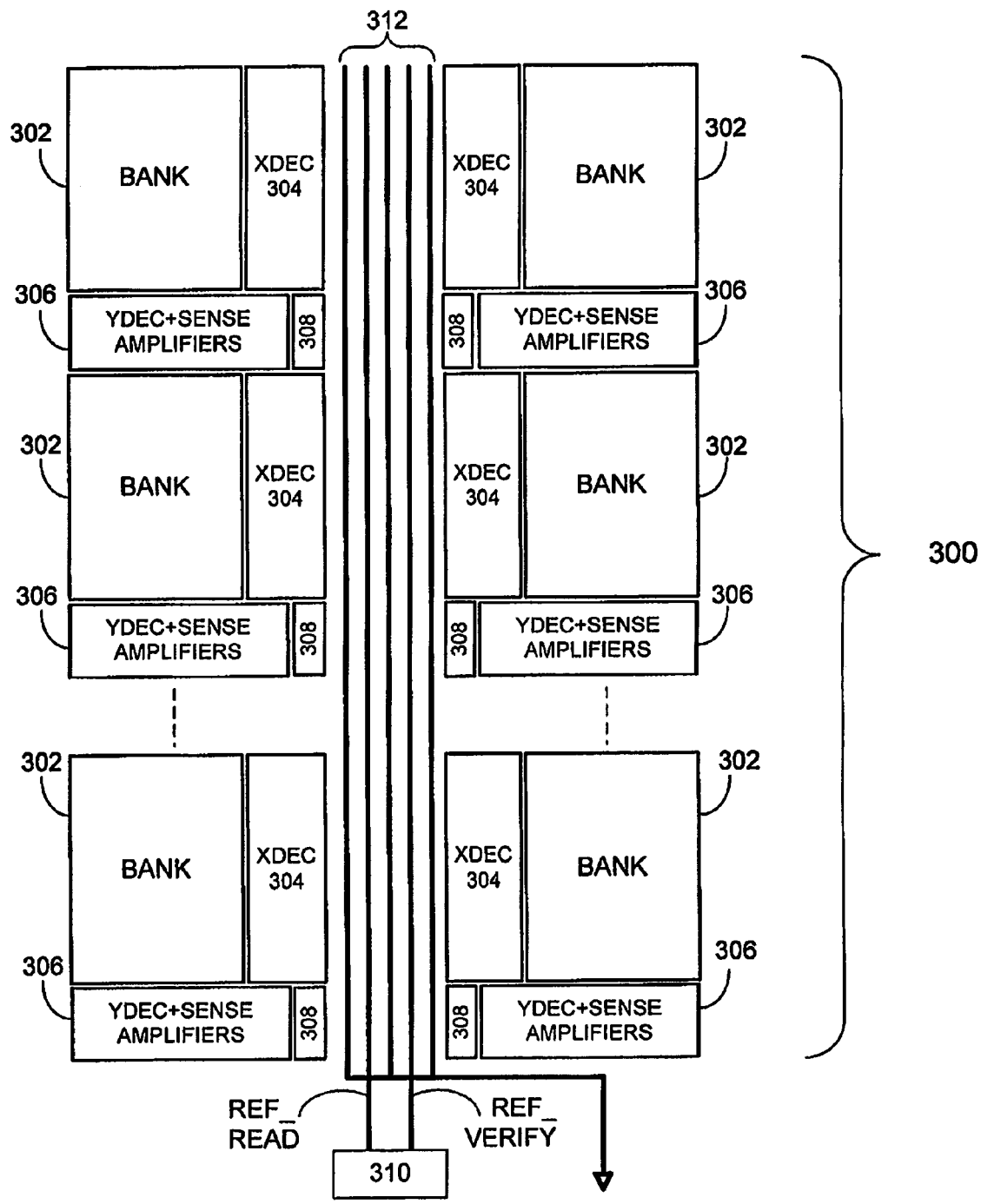
FIG. 3 is a schematic diagram illustrating one embodiment of the invention.

FIG. 3 is a schematic diagram illustrating one embodiment of the invention in a non-volatile memory 300. A non-volatile memory 300 has, for example, memory banks 302 connected to X-decoders 304 and sense amplifiers 306. Biasing circuits 308 connect to sense amplifiers 306. Both the biasing circuits 308 and the sense amplifiers 306 are local to memory banks 302, in other words a given biasing circuit and a given sense amplifier serve a particular memory bank. Typically the sense amplifiers 306 include Y-decoders, while the X-decoder 304 is also local to a particular memory bank. Keeping sense amplifiers 306 local avoids the problem of offset arising in some conventional systems.

A reference cell matrix 310 attaches to each of the biasing circuits 308 and is global, i.e. it provides reference cell current to multiple biasing circuits 308. In FIG. 3, six memory banks are illustrated, though less or more may be implemented in system 300. All six memory banks are connected to a global reference cell 310. In another embodiment, the reference cell matrix 310 may be connected to less or more memory banks 302, and need not be connected to every memory bank 302 in system 300. Lines 312 may be connected to ground in order to shield reference current from interference and noise.

During a memory read operation, for example, one of the biasing circuits 308 biases the reference cell matrix 310 in order that the reference cell matrix 310 may provide reference cell current to one of the sense amplifiers 306. Then the sense amplifier 306 that receives the reference cell current compares the reference cell current to current in a memory cell (see FIG. 4) of memory banks 302 in order that the value of data held in the memory cell may be determined. The system 300 provides a global reference cell matrix 310 for multiple memory blocks 302, as opposed to conventional systems, which utilizes a local reference matrix for each memory block.

Figure 1:
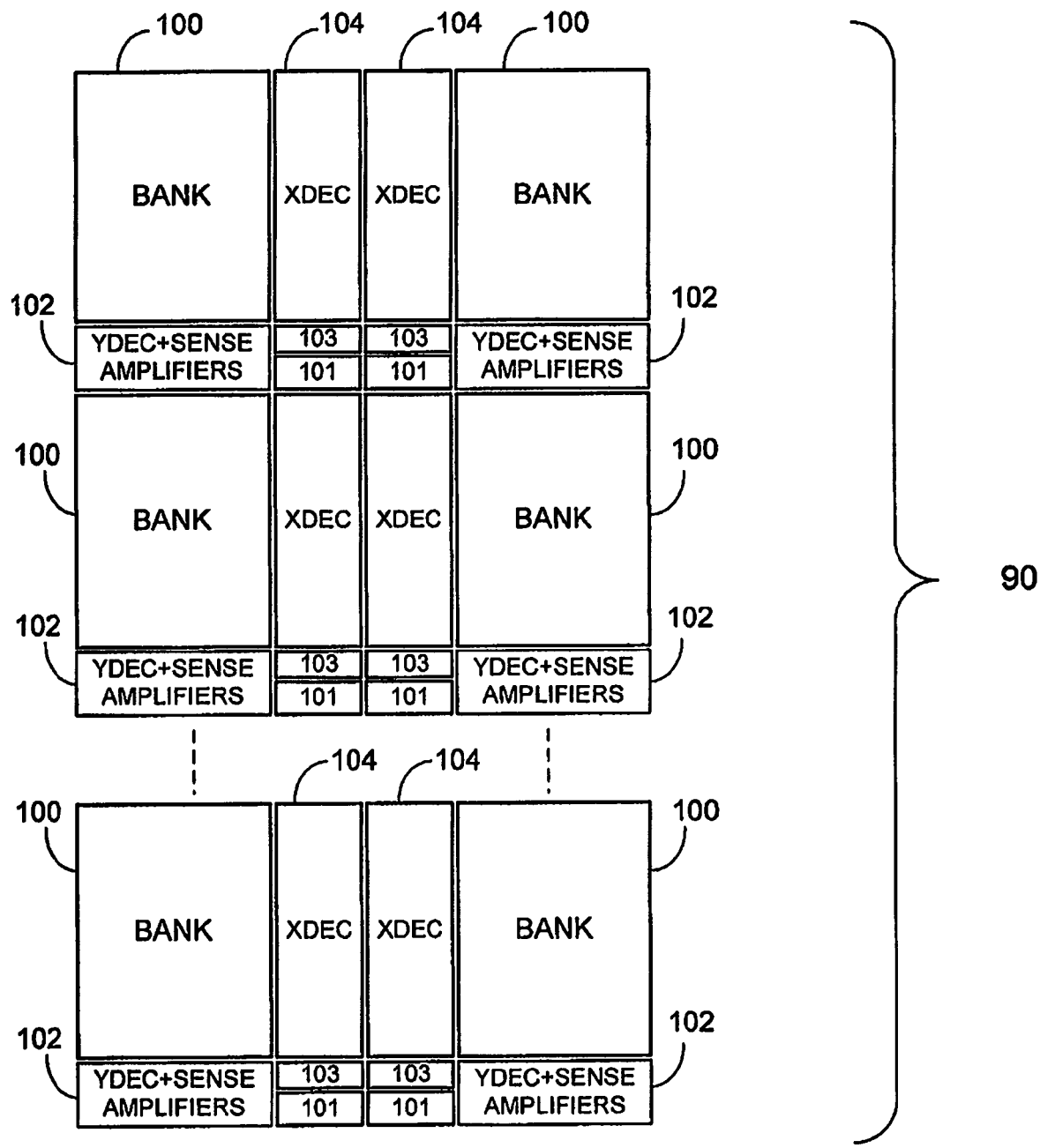
FIG. 1 is a schematic diagram illustrating a conventional memory and reference cell routing system.
Figure 2:
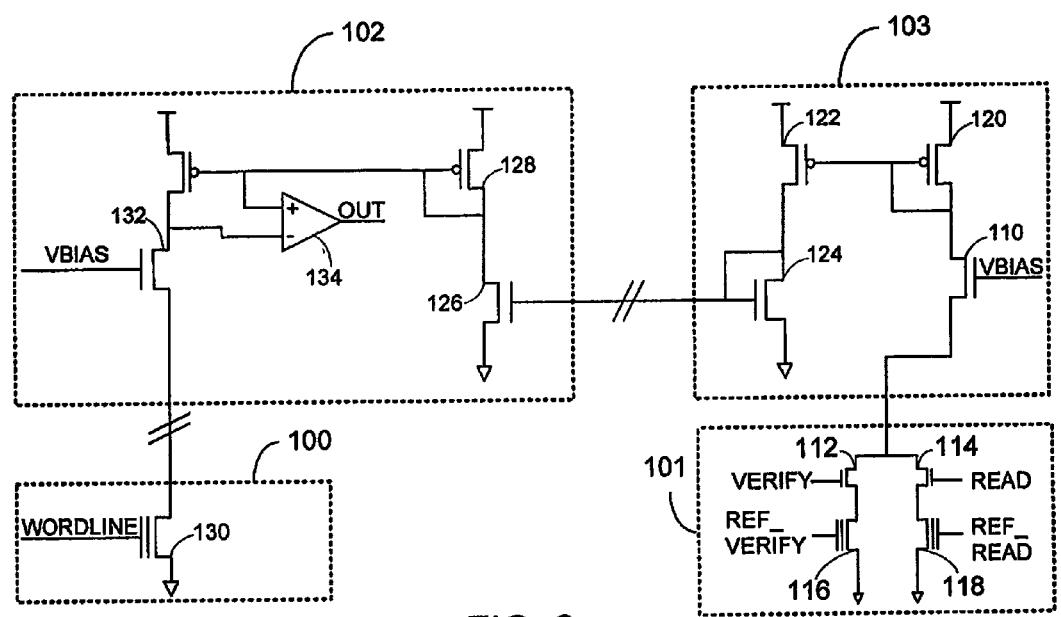
FIG. 2 is a schematic diagram illustrating components of the conventional system from FIG. 1.
Figure 4:
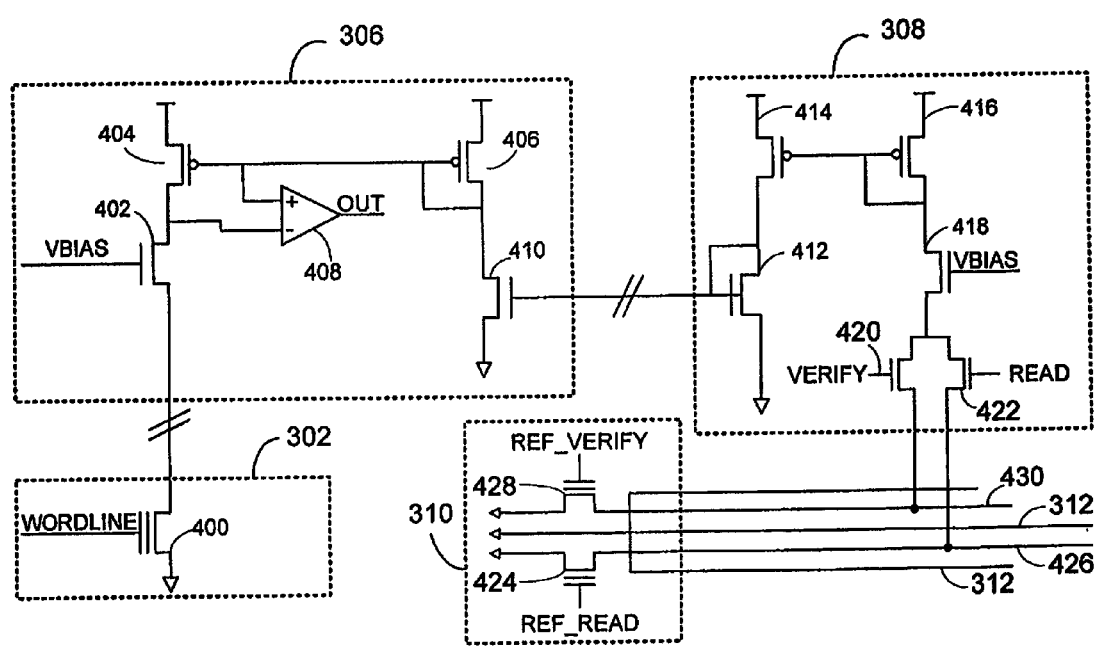
FIG. 4 is a schematic diagram illustrating more detail of the embodiment from FIG. 3.

FIG. 4 is a schematic diagram illustrating more detail from system 300 from FIG. 3. The memory bank 302 includes, among other circuits, a memory cell 400. In sense amplifiers 306, a transistor 402 connects to the memory cell 400 and other circuits (not shown). Transistors 404 and 406 connect to provide a point of contact for an amplifier 408, which compares current through the memory cell 400 with a reference cell current during memory read operations, for example. Although only a single memory cell 400 and a single amplifier 306 are illustrated in FIG. 4, a typical non-volatile memory has more than one of each of these. For example, one of the memory banks 302 typically has more than one memory cell 400, while one of the sense amplifiers 306 typically has more than one amplifier 408.

Transistors 410 and 412 comprise a current mirror to reflect current through the biasing circuit 308 to the sense amplifiers 306. Multiple sense amplifiers 306 are typically connected to each biasing circuit 308. Transistors 414 and 416 comprise a current mirror to reflect reference cell current passing through the reference cell matrix 310 to the biasing circuit 308.

A bias transistor 418 biases both of the transistors 420 and 422, which in one embodiment are verify and read transistors. The verify transistor 420 may be biased for a memory verify operation, while the read transistor 422 may be biased for a memory read operation. One of the memory banks 302 may be conducting a memory verify operation with the transistors 418 and 420 biased (respective to the relevant memory bank 302), while another memory bank is conducting a memory read operation with the transistors 418 and 422 biased (respective to the relevant memory bank 302).

During a memory read operation, for example, the read transistor 422 biases the read cell 424 through the read cell line 426. During a memory verify operation, for example, the verify transistor 420 biases the verify cell 428 through the verify cell line 430. The verify cell 428 and the read cell 424 are part of the global reference cell matrix 310, serving multiple memory banks 302. The lines 312 may be grounded and function to shield the verify cell line 430 and the read cell line 426 from interference and noise that could decrease error margin.

The advantages of the invention include minimizing test time, reducing circuit footprint by keeping local the circuitry that biases the reference cells. The number of reference cells are reduced and placed in a global location and offset is avoided by using local sense amplifiers.

The present invention has been described in accordance with the embodiments shown, and one of ordinary skill in the art will readily recognize that there could be variations to the embodiments, and any variations would be within the spirit and scope of the present invention. Accordingly, many modifications may be made by one of ordinary skill in the art without departing from the spirit and scope of the appended claims.

We claim:

1. A non-volatile memory comprising:
   a plurality of banks of memory cells;
   a plurality of sets of sense amplifiers coupled to the plurality of banks of memory cells, wherein each of the sense amplifiers is configured to perform memory operations;
   a plurality of biasing circuits coupled to the plurality of banks of memory cells; and
   a reference cell matrix coupled to the plurality of biasing circuits and configured to provide reference cell current to the plurality of biasing circuits and to the plurality of sense amplifiers.

2. The non-volatile memory of claim 1, the reference cell matrix comprising:
   a verify cell coupled to the plurality of biasing circuits through a verify cell line; and
   a read cell coupled to the plurality of biasing circuits through a read cell line.

3. The non-volatile memory of claim 2, the reference cell matrix further comprising:
   a grounded line shielding the verify cell line and the read cell line.

4. The non-volatile memory of claim 2, the reference cell matrix further comprising:
   a plurality of grounded lines shielding the verify cell line and the read cell line.

5. The non-volatile memory of claim 2, wherein each of the plurality of biasing circuits comprises:
   a current mirror coupled to the plurality of sets of local sense amplifiers;
   a bias transistor coupled to the current mirror;
   a read select transistor coupled to the bias transistor and to the read cell line; and
   a verify select transistor coupled to the bias transistor and to the verify cell line.

6. A system for avoiding offset and reducing the footprint of a non-volatile memory, the system comprising:
- a plurality of memory bank circuits, each memory bank circuit having a plurality of memory cells;
- a plurality of sense amplifiers coupled to the plurality of memory cells;
- a plurality of row and column decoders coupled to the plurality of memory cells;
- a plurality of biasing circuits coupled to the plurality of sense amplifiers; and
- a reference cell matrix coupled to the plurality of biasing circuits and configured to provide reference cell current to the plurality of biasing circuits and to the plurality of sense amplifiers.

7. The system of claim 6, the reference cell matrix further comprising:
- a verify cell coupled to the plurality of memory bank circuits through a verify cell line;
- and a read cell coupled to the plurality of memory bank circuits through a read cell line.

8. The system of claim 7, the reference cell matrix further comprising:
- a grounded line shielding the verify cell line and the read cell line.

9. The system of claim 7, the reference cell matrix further comprising:
- a plurality of grounded lines shielding the verify cell line and the read cell line.

10. The system of claim 7, each of the biasing circuits further comprising:
- a current minor coupled to the plurality of sense amplifiers;
- a bias transistor coupled to the current minor;
- a read select transistor coupled to the bias transistor and to the read cell line; and
- a verify select transistor coupled to the bias transistor and to the verify cell line.

11. A method for avoiding offset and reducing the footprint of a non-volatile memory having a plurality of memory bank circuits, each memory bank circuit having memory cells coupled to sense amplifiers, row and column decoders coupled to the memory cells, and biasing circuits coupled to the sense amplifiers, the method comprising:
- connecting a reference cell matrix to the plurality of biasing circuits; and
- providing reference cell current, utilizing the reference cell matrix, to the plurality of biasing circuits and to the plurality of sense amplifiers.

12. The method of claim 11 wherein the reference cell matrix comprises a verify cell coupled to the plurality of memory bank circuits through a verify cell line, and a read cell coupled to the plurality of memory bank circuits through a read cell line.

13. The method of claim 12 further comprising:
- shielding the verify cell line and the read cell line with a grounded line.

14. The method of claim 12 further comprising:
- shielding the verify cell line and the read cell line with a plurality of grounded lines.

* * * * *